United States Patent
Jerez et al.

(10) Patent No.: US 10,468,220 B1
(45) Date of Patent: Nov. 5, 2019

(54) INDIRECTLY HEATED CATHODE ION SOURCE ASSEMBLY

(71) Applicant: iON Technology Solutions, Mineola, NY (US)

(72) Inventors: Manuel A. Jerez, Rockville Center, NY (US); Carlos F. M. Borges, Roslyn Estates, NY (US); Amnon Parizat, Old Westbury, NY (US)

(73) Assignee: ION TECHNOLOGY SOLUTIONS, LLC, Mineola, NY (US)

( * ) Notice: Subject to any disclaimer, the term of this patent is extended or adjusted under 35 U.S.C. 154(b) by 0 days.

(21) Appl. No.: 16/185,358

(22) Filed: Nov. 9, 2018

(51) Int. Cl.
| | |
|---|---|
| H01J 37/08 | (2006.01) |
| H01J 27/18 | (2006.01) |
| H01J 27/08 | (2006.01) |
| H01J 37/32 | (2006.01) |
| H05H 1/46 | (2006.01) |

(52) U.S. Cl.
CPC .............. *H01J 27/18* (2013.01); *H01J 27/08* (2013.01); *H01J 37/32055* (2013.01); *H05H 1/46* (2013.01)

(58) Field of Classification Search
CPC .......... H01J 37/08; H01J 37/317; H01J 27/08; H01J 2237/061; H01J 2237/08; H01J 2237/082; H01J 2237/31701; H01J 1/28; C23C 14/48; Y10S 438/961
See application file for complete search history.

(56) References Cited

U.S. PATENT DOCUMENTS

| | | | | |
|---|---|---|---|---|
| 5,218,263 | A * | 6/1993 | Falce | H01J 1/28 313/270 |
| 5,497,006 | A * | 3/1996 | Sferlazzo | H01J 27/14 250/423 R |
| 5,763,890 | A * | 6/1998 | Cloutier | H01J 27/08 250/427 |
| 8,253,334 | B2 * | 8/2012 | Jerez | H01J 27/08 250/426 |
| 8,319,410 | B2 * | 11/2012 | Jerez | H01J 27/08 313/230 |
| 8,653,475 | B1 * | 2/2014 | Jerez | H01J 27/00 250/423 R |
| 8,796,649 | B2 * | 8/2014 | Jerez | H01J 37/3171 250/423 R |
| 10,217,600 | B1 * | 2/2019 | Borges | H01J 37/08 |

* cited by examiner

*Primary Examiner* — Haissa Philogene
(74) *Attorney, Agent, or Firm* — Francis C. Hand; Carella, Byrne, et al.

(57) ABSTRACT

The indirectly heated cathode ion source assembly employs a cathode having a cup shaped body with a base and a cylindrical periphery, a thermal barrier having a plurality of cylindrical foils concentric to the cathode to reduce thermal loss; and a holder receiving the cathode and the thermal barrier in concentric relation.

12 Claims, 5 Drawing Sheets

INDIRECTLY HEATED CATHODE ION SOURCE ASSEMBLY

FIELD OF THE INVENTION

This invention relates to an indirectly heated cathode ion source assembly. More particularly, this invention relates to an ion implanter having a high efficient cathode emitter that emits thermal electrons to ionize a gas inside of an arc chamber to form a plasma to generate an ion beam for beam treatment of a work piece or faces in a workpiece processing tool.

BACKGROUND OF THE INVENTION

Ion implantation is a process used to dope impurity ions into a semiconductor substrate. In accordance with the process, an ion beam is directed from an ion source chamber toward a substrate. The depth of implantation into the substrate is based on the ion implant energy and mass of the ions generated in the source chamber. A precise doping profile in the substrate is critical to proper device operation. One or more types of ion species may be implanted in different doses and at different energy levels to obtain desired device characteristics.

During implantation or other workpiece processing, accelerated ions will sputter materials off any impinged surface eroding the surface.

Ion sources that generate the ion beams used in existing implanters are typically called arc ion sources and can include heated filament cathodes for creating ions that are shaped into an appropriate ion beam for wafer treatment.

U.S. Pat. No. 5,497,006 describes an ion source having a cathode and anti-cathode (repeller) disposed in the gas confinement chamber. The ion source further includes a solid aluminum block for retaining the gas confinement chamber with a support portion of the base. The cathode is a tubular conductive body and endcap that partially extends into the gas confinement chamber. A filament is supported within the tubular body and emits electrons that heat the endcap through electron bombardment, thermionically emitting the ionizing electrons into gas confinement chamber.

U.S. Pat. No. 8,253,334 also discloses a cathode sub-assembly comprised of a retainer, a cathode and collar, each of which has smooth unthreaded surfaces that slidably engage each other. A shield serves to hold the sub-assembly in a support plate. The cathode projects from the sub-assembly into an arc chamber with a tortuous path created therebetween for passage of the plasma flow.

U.S. Pat. No. 5,763,890 also discloses an arc ion source for use in an ion implanter. The ion source includes a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

U.S. Patent Application 2011/0156570 also discloses a cathode assembly for use in an ion implanter. The ion source includes a gas confinement chamber having a filament clamp assembly. The filament clamp assembly has a pair of bifurcate clamps to hold the connecting leads of a filament within a cavity of a cathode of a separate cathode assembly. The filament clamp assembly is mounted on the insulator block in self-aligning relation. The cathode assembly has a tungsten cathode with an internal cavity to receive the filament that is secured within a retainer shield made of tungsten, molybdenum and graphite by a threaded graphite cylindrical collar.

U.S. Pat. No. 7,750,313 proposes to improve the plasma generation efficiency and gas use efficiency as well as to ensure a longer service life an ion source. As described, a cathode holder of tubular shape is inserted into an opening and positioned such that a surface thereof opposes or surrounds a side surface of a cathode. The cathode is held in the cathode holder so that a front surface of the cathode will be positioned on the same plane as, outward from, or inward from the inner wall surface. The cathode holder is also provided with a tubular first heat shield surrounding the cathode with a space provided between the first heat shield and the cathode. A surface of the first heat shield is positioned to oppose or surround the side surface of the cathode. A filament is provided at a rear end of the cathode and a gap between the cathode holder and the plasma generating chamber is filled with an electrical insulating material.

U.S. Pat. No. 9,425,023 discloses a cathode that extends outward from the inside of an arc chamber in an axial direction and that emits a thermal electron into the arc chamber, a thermal reflector with a cylindrical shape provided around the cathode in a radial direction and extending in the axial direction, and a narrow structure configured to narrow a width in the radial direction of a gap between the cathode and the thermal reflector at a given position in the axial direction.

U.S. Pat. No. 9,659,755 discloses a plasma generator including an arc chamber having a plasma generation region in which plasma is generated in the inside thereof; a magnetic field generator is configured to apply a magnetic field to the plasma generation region; and a cathode is configured to extend in an axial direction along an applying direction of the magnetic field to the plasma generation region and is provided with a cathode cap that emits thermal electrons at a front end thereof. The cathode cap protrudes toward the inside of the arc chamber in the axial direction and has a shape of which a width in the radial direction perpendicular to the axial direction becomes smaller toward the inside of the arc chamber.

Pending U.S. patent application Ser. No. 15/788,428, filed Oct. 19, 2017, describes a cathode cup unit constructed of a disc-shaped body, a pair of semicircular elements concentric to and holding the body therebetween and a cylindrical retainer concentrically housing the body and elements and forming a thermal reflector in order to reduce the number of parts.

Other sources may drive RE, microwave or electron beam discharges to generate desired ions. These sources generate plasma densities 10-100 times lower than arc ion sources and are typically used with source materials that have low ionization potentials (species that are easy to ionize) or when the source chamber includes large ion extraction areas. Cold ion sources, such as shown in U.S. Pat. No. 6,975,072, can have source materials made of relatively low temperature materials, such as stainless steel, copper or aluminum. Hot sources, such as, arc ion sources expose the source chamber walls to an arc plasma at temperatures of several tens of thousands of degree Celsius and high thermal power densities which have required source components of prior art implanters to be made of high temperature, so called refractory, materials, such as molybdenum, tantalum or tungsten.

Accordingly, it is an object of the invention to improve the life performance of a cathode assembly during ion beam operation.

It is another object of the invention to provide an indirectly heated cathode (IHC) ion source assembly that can be used in all ion source arrangements.

It is another object of the invention to provide an indirectly heated cathode (IHC) ion source assembly that can be fitted in OEM implant systems as well as iTS ion sources.

It is another object of the invention to provide an improved cathode assembly structure for ion implanters that reduces the number of parts, improves the thermal electron emission, reduces the cathode erosion and reduces ion implanter downtime.

SUMMARY OF THE INVENTION

Briefly, the invention provides an indirectly heated cathode ion source assembly for use in creating a stream of ions.

The assembly includes a cathode sub-assembly for use with an ion source for generating a beam of ions and a filament coaxially disposed within the cathode sub-assembly.

The cathode sub-assembly is comprised of a cathode having a cup shaped body with a base and a cylindrical periphery extending from the base; a thermal barrier having a plurality of cylindrical foils concentric to the periphery of the cathode to reduce thermal loss; and a holder receiving the cathode and the thermal barrier therein in concentric relation.

In addition, the base and the cylindrical periphery of the cathode form an annular recess in a bottom corner of the cathode that has an angular sidewall for reflecting heat.

The thermal barrier is constructed of a plurality of cylindrical foils concentric to the cathode to reduce thermal loss. Each foil functions as a thermal break liner to minimize thermal losses and to maintain a high temperature in the region of the filament.

The filament is coaxially disposed within the cathode for generating thermal electrons at a face thereof and is spaced from the base of the cathode a predetermined distance. The face of the filament is flat and the filament has a pair of parallel leads supporting the face.

In addition, the assembly includes a graphite support plate having the leads of the filament passing therethrough and a thermal shield spacer mounted on the graphite support plate in spaced relation to the face of the filament and with the leads of the filament passing therethrough. The thermal shield spacer is also disposed within the holder.

The cathode is mounted in the holder via a bayonet connection. For example, the cathode has a plurality of tabs on a periphery of the base and the holder has an inwardly directed annular collar at one end with a plurality of slots for passage of the tabs therethrough.

The holder is, in turn, mounted in the support plate by being threaded into the support plate.

The cathode, preferably constructed from tungsten, is designed to achieve a very high temperature (i.e. 2,973.15K) to maximize the thermal electron emission.

These and other objects and advantages of the invention will become more apparent from the following detailed description taken in conjunction with the drawings wherein.

DETAILED DESCRIPTION OF THE INVENTION

Figure 1:
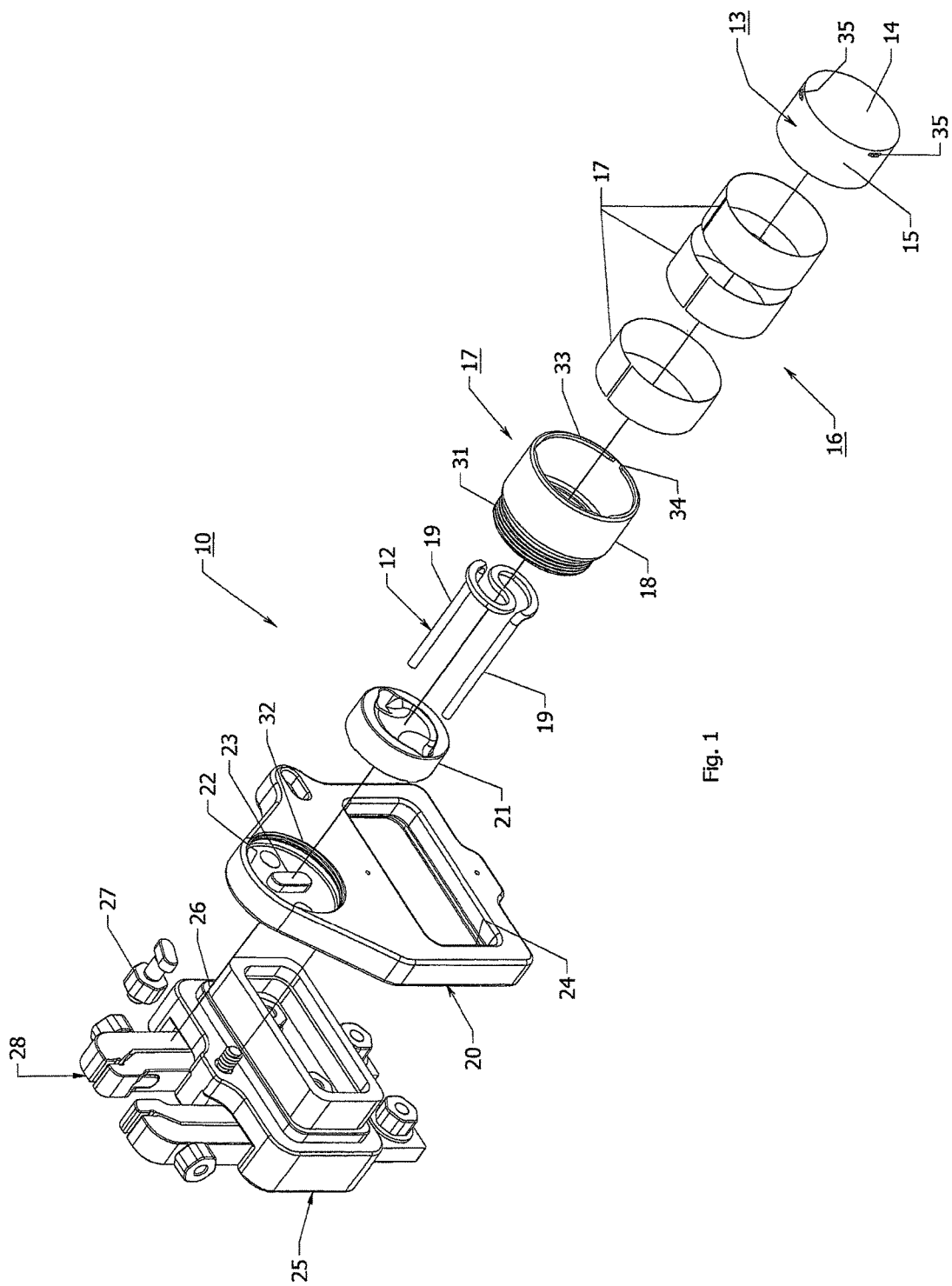
FIG. 1 illustrates an exploded view of an indirectly heated cathode ion source in accordance with the invention.
Figure 2:
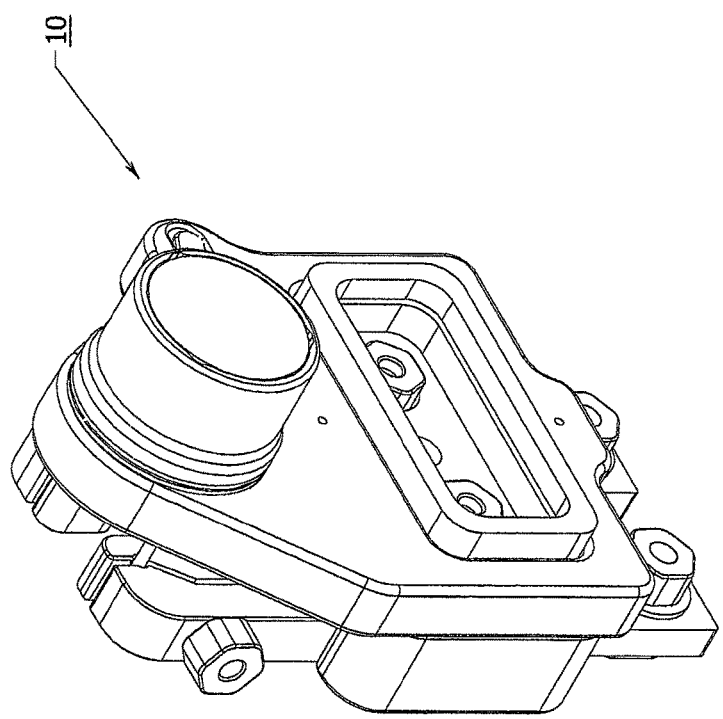
FIG. 2 illustrates a view of an indirectly heated cathode ion source in accordance with the invention.

Referring to FIGS. 1 to 4, the indirectly heated cathode ion source assembly 10 is constructed for use in creating a stream of ions for ion implanters, such as the indirectly heated cathode ion source assembly described in Pending U.S. patent application Ser. No. 15/788,428.

The indirectly heated cathode ion source assembly 10 comprises a cathode sub-assembly 11 and a filament 12 of conventional structure and material coaxially disposed within the cathode sub-assembly 11.

The cathode sub-assembly 11 includes a cathode 13 having a cup shaped body with a base 14 and a cylindrical periphery 15 extending from the base; a thermal barrier 16 having a plurality of cylindrical foils 17 concentric to the periphery of the cathode 13 to reduce thermal loss; and a holder 18 receiving the cathode 13 and the thermal barrier 16 therein in concentric relation.

Figure 4:
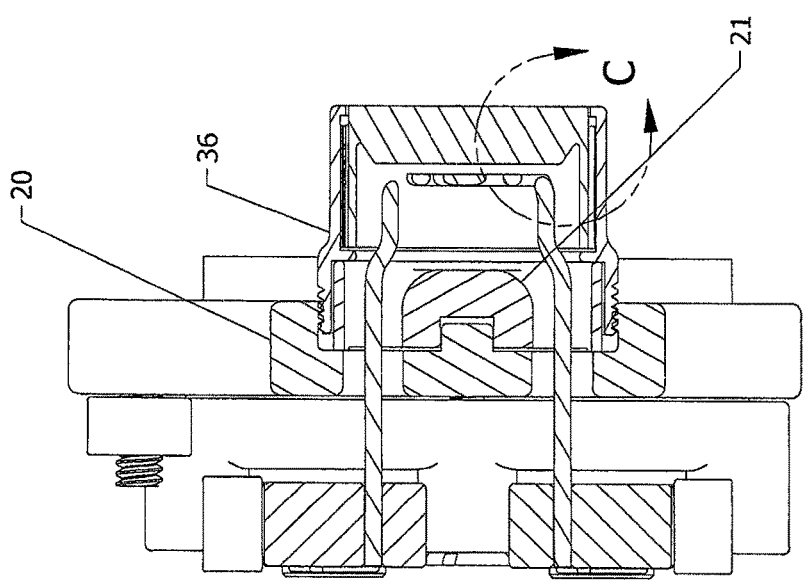
FIG. 4 illustrates a side view of the indirectly heated cathode ion source of FIG. 2.

As shown in FIG. 4, the filament 12 is disposed within the cathode 13 for generating thermal electrons at a face thereof and is spaced from the base 14 of the cathode 13 a predetermined distance. The filament 12 has a pair of parallel leads 19 supporting the face.

The indirectly heated cathode ion source assembly 10 also includes a graphite support plate 20 that acts as a thermal barrier and that has the leads 19 of the filament 12 passing therethrough. In addition, a thermal shield spacer 21 is mounted on the graphite support plate 20 in spaced relation to the face of the filament 12 and has the leads 19 of the filament 12 passing therethrough.

As shown in FIG. 4, the thermal shield spacer 21 is also disposed within the holder 18.

As indicated in FIG. 1, the thermal shield spacer 21 is of circular shape and is sized to fit into a circular cavity 22 in the front face of the graphite support plate 20. In addition, the thermal shield spacer 21 has a recess (not shown) in a rear face, as viewed, that is sized to fit onto an alignment block 23 in the cavity 22 of the support plate 20.

Referring to FIG. 1, the support plate 20 has an aperture 24 of rectangular shape for fitting onto an insulator block of alumina ($Al_2O_3$) 25. In addition, the support plate 20 is secured by a pair of screws 26 (only one of which is shown) directly to the insulator block 25 and by a single screw 27 to a filament clamp 28 on the insulator block 25.

As indicated in FIG. 4, the leads 19 of the filament 12 are clamped in the filament clamp 28 in known manner.

Figure 5:
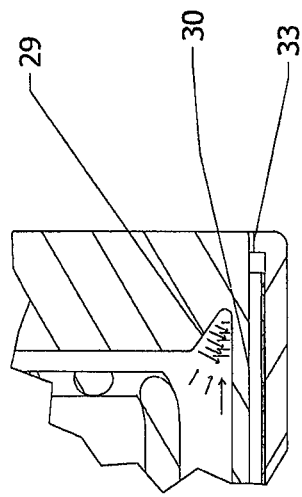
FIG. 5 illustrates a partial cross-sectional view of the cathode of the indirectly heated cathode ion source of FIG. 2.

Referring to FIG. 5, the cathode 13 is made of tungsten and the base 14 and the cylindrical periphery 15 of the cathode form an annular recess 29 in a bottom corner of the cathode 13 that reduces the mass of the cathode 13 and that has an angular sidewall 30 for reflecting heat in order to improve the cathode surface temperature.

Referring to FIG. 1, the holder 18 is of hollow cylindrical shape and has an external thread 31 at one end for threading into an internal thread 32 in the cavity 22 in the front face of the graphite support plate 20 concentrically of the thermal shield spacer 21.

The holder 18 also has an inwardly directed annular collar 33 at an opposite end with a plurality of slots 34 and the cathode 13 has a plurality of tabs 35, e.g. two, on a periphery of the base 14 for passage through the slots in the holder 18.

The cathode 13 is mounted in the holder 18 by passing the tabs 35 on the cathode 13 through the slots 34 in the holder 18 and then rotating the cathode 13 relative to the holder 18.

Referring to FIG. 4, the holder 18 also has an inwardly directed flange 36 at an intermediate point to act as a stop for positioning of the cathode 13 in the holder 18 as well as the foils 17.

Referring to FIG. 1, the foils 17 of the thermal barrier 16 are concentric to the periphery 15 of the cathode 13 with a very small gap (0.004") therebetween to reduce thermal loss.

The three foils 17 are made of a high melting point material, including tungsten (W) and tantalum (Ta), for example, and are of split construction. In addition, each circular foil 17 is heat treated to keep a round form shape. Due to the split construction, each foil 17 has a spring like action. These foils 17 help to keep a high temperature on the cathode 13 and avoid a heat loss around the cathode 13 by trapping the generated heat within the cathode 13.

In order to maintain a high temperature on the cathode cup body, each thermal break 17 should have a shape that is long in the axial direction and a very small wall thickness, to reduce the thermal conductivity.

As shown in FIGS. 4 and 5, when in place, the face of the cathode 13 is flush with the end of the holder 18 to present a smooth transition between the two parts 13,18.

Figure 3:
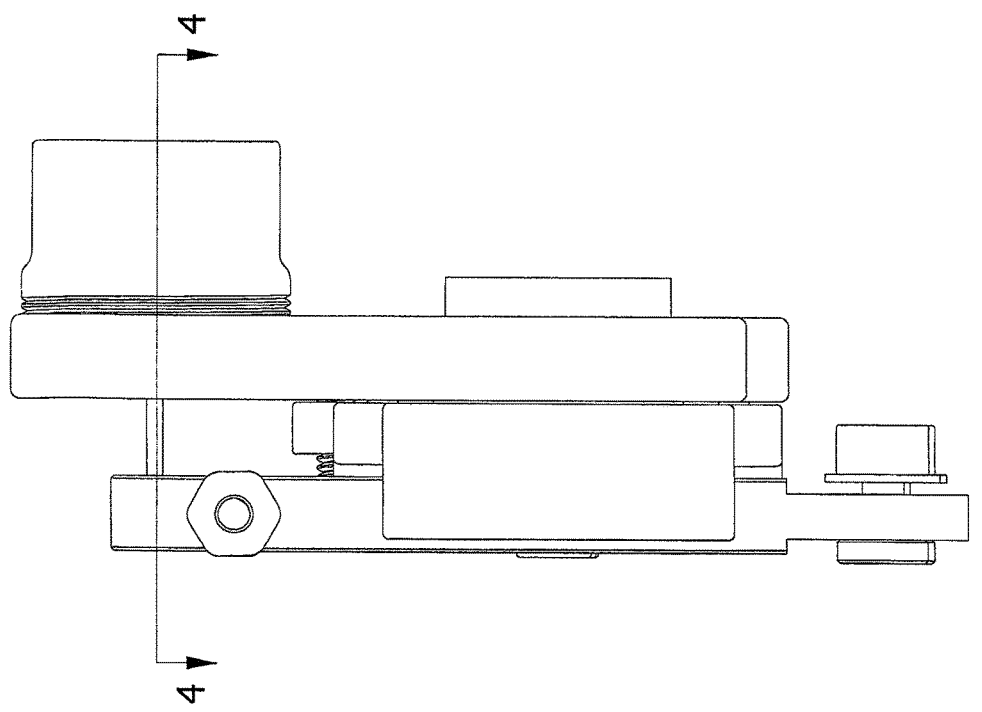
FIG. 3 illustrates a cross-sectional view of the indirectly heated cathode ion source of FIG. 2.

Referring to FIG. 3, the filament 12 is coaxially disposed within the cathode 13 for generating thermal electrons at a face thereof spaced from the base a predetermined distance. The face of the filament 12 is flat, for example, being grounded flat to reduce the cross-section to increase the electrical resistivity. The reduced cross-section on the filament 12 will increase the temperature and improve the thermal electron emission during use.

In order to assemble the indirectly heated cathode ion source assembly 10, the support plate 20 is mounted on the insulator block 25 and the thermal shield spacer 21 is fitted into the cavity 22 of the support plate 20. Next, the leads 19 of the filament 12 are passed through the thermal shield spacer 21 and support plate 20 and mounted in the clamp 28.

Next, the holder 18 is threaded into the support plate 20, the foils 17 are inserted into the holder 18 and the cathode 13 fitted into the holder 18 via the bayonet-type connection afforded by the tabs 35 and butted against the internal flange 36 within the holder 18.

Alternatively, the holder 18, foils 17 and cathode 13 may be assembled as a cathode sub-assembly 11 and then the entire subassembly may be threaded into the support plate 20.

During use, the filament 12 is heated by a filament power supply (not shown) and generates thermal electrons at the front end thereof and collide with the base 14 of the cathode 13, which is heated with the heat generated by the energy of the collision.

The cathode 13 is preferably maintained at a high temperature in order to improve the generation of thermal electrons, As indicated in FIG. 4, the three concentric circular tungsten foils 17 have a very small gap between each circular foil. Each circular tungsten foil has a minimum thickness and large surface area to reduce the thermal conductivity $$k = \frac{Q\Delta x}{A(T_2 - T_1)},$$

where Q is rate of heat transferred, $\Delta x$ is the foil thickness, A is the surface area of the foil, and T is the temperature. Each circular foil 17 will reduce the thermal losses, working as a thermal barrier. The thermal break (barrier) will help to maintain the high temperature in the region of the filament 12, By way of example, the three tungsten foils 17 may have a nominal radial space (gap) of 0.002 inches. During operation, each foil 17 will expand under heat and the gap can increase thereby improving the thermal break (barrier).

The use of the foils 17 serves to increase the heat generated within the cathode 13. For example, tests have shown that without any foil 17, the surface temperature on the cathode 13 surface was 2430° C.; with one foil 18, the surface temperature on the cathode 13 surface was 2460° C.; with two foils 18, a temperature of 2490° C.; and with three foils 18, a temperature of 2590° C.

The invention thus provides a cathode assembly with an improved life performance of a cathode assembly during ion beam operation.

The invention also provides an indirectly heated cathode (IHC) ion source assembly that can be used in all ion source arrangements, that can be fitted in OEM implant systems as well as iTS ion sources and that reduces the number of parts, improves the thermal electron emission, reduces the cathode erosion and reduces ion implanter downtime.

What is claimed is:

1. An indirectly heated cathode ion source assembly for use in creating a stream of ions comprising
    a cathode having a cup shaped body with a base and a cylindrical periphery extending from said base;
    a thermal barrier having a plurality of cylindrical foils concentric to said periphery of said cathode to reduce thermal loss;
    a holder receiving said cathode and said thermal barrier therein in concentric relation;
    a filament coaxially disposed within said cathode for generating thermal electrons at a face thereof and spaced from said base of said cathode a predetermined distance, said filament having a pair of parallel leads supporting said face;
    a graphite support plate having said leads of said filament passing therethrough; and
    a thermal shield spacer mounted on said graphite support plate in spaced relation to said face of said filament and with said leads of said filament passing therethrough.

2. An assembly as set forth in claim 1 wherein said thermal shield spacer is disposed within said holder.

3. An assembly as set forth in claim 1 wherein said base and said cylindrical periphery form an annular recess having an angular sidewall for reflecting heat.

4. An assembly as set forth in claim 1 wherein said cathode has a plurality of tabs on a periphery of said base and said holder has an inwardly directed annular collar at one end thereof with a plurality of slots therein for passage of said tabs therethrough.

5. An assembly as set forth in claim 1 wherein said holder is threaded into said support plate.

6. An assembly as set forth in claim 1 wherein each of said cylindrical foils is split.

7. An assembly as set forth in claim 1 wherein each of said cylindrical foils is made of tungsten.

8. A cathode sub-assembly for use with an ion source for generating a beam of ions comprising
    a cathode having a cup shaped body with a base and a cylindrical periphery extending from said base;

a thermal barrier having a plurality of cylindrical foils concentric to said periphery of said cathode to reduce thermal loss; and a holder receiving said cathode and said thermal barrier therein in concentric relation.

9. A cathode sub-assembly as set forth in claim 8 wherein said base and said cylindrical periphery form an annular recess having an angular sidewall for reflecting heat.

10. A cathode sub-assembly as set forth in claim 8 wherein said cathode has a plurality of tabs on a periphery of said base and said holder has an inwardly directed annular collar at one end thereof with a plurality of slots therein for passage of said tabs therethrough.

11. A cathode sub-assembly as set forth in claim 8 wherein said holder is threaded into said support plate.

12. A cathode sub-assembly as set forth in claim 8 wherein said plurality of cylindrical foils are made of tungsten and have a nominal radial space therebetween of 0.002 inches.

\* \* \* \* \*